Figure 1:
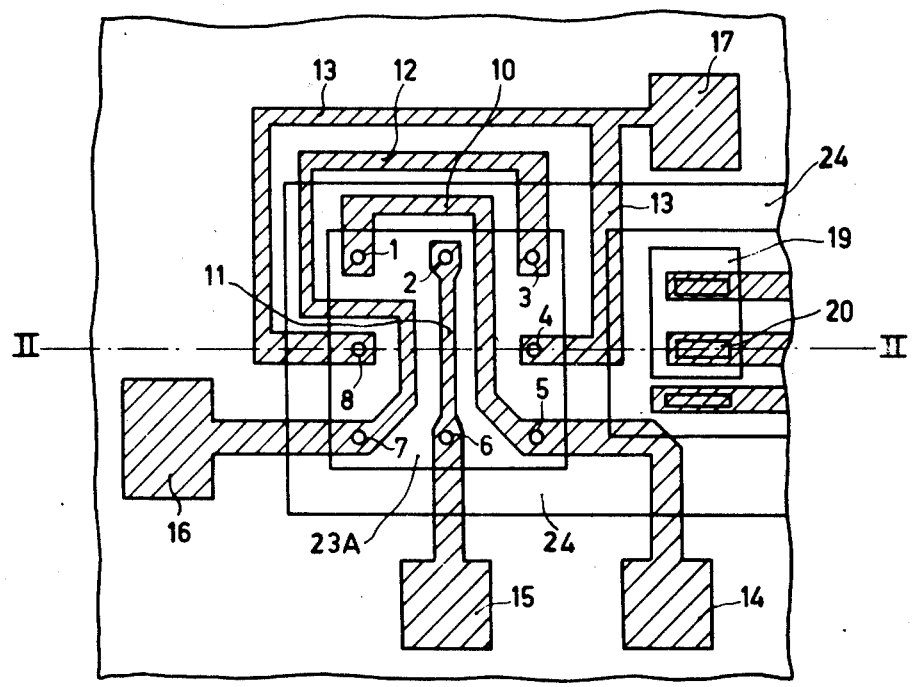

United States Patent [19]
Janssen

[11] 4,123,772
[45] Oct. 31, 1978

[54] MULTISEGMENT HALL ELEMENT FOR OFFSET VOLTAGE COMPENSATION

[75] Inventor: Johannes H. H. Janssen, Eindhoven, Netherlands

[73] Assignee: U.S. Philips Corporation, New York, N.Y.

[21] Appl. No.: 801,924

[22] Filed: May 31, 1977

Related U.S. Application Data

[63] Continuation of Ser. No. 654,557, Feb. 2, 1976, abandoned, which is a continuation of Ser. No. 474,588, May 30, 1974, abandoned.

[30] Foreign Application Priority Data

Jun. 18, 1973 [NL] Netherlands ................ 7308409

[51] Int. Cl.² ................ H01L 27/22; H01L 43/06
[52] U.S. Cl. ................ 357/27; 307/309; 357/36; 357/46; 357/48; 357/51
[58] Field of Search ................ 357/27, 36, 46, 48, 357/51; 307/309; 330/6

[56] References Cited

U.S. PATENT DOCUMENTS

| | | | |
|---|---|---|---|
| 2,774,890 | 12/1956 | Semmelman | 357/27 |
| 3,522,494 | 8/1970 | Bosch | 357/27 |
| 3,823,354 | 7/1974 | Janssen | 357/27 |
| 3,852,802 | 12/1974 | Wolf et al. | 357/27 |
| 3,995,304 | 11/1976 | Pease | 357/36 |

OTHER PUBLICATIONS

Collins et al., IBM Tech. Discl. Bulletin, vol. 12, No. 12, May 1970, p. 2163 (307-309).

*Primary Examiner*—William D. Larkins
*Attorney, Agent, or Firm*—Frank R. Trifari

[57] ABSTRACT

A semiconductor device having a Hall element in which, in order to reduce the offset, the Hall element consists of an even number of sub-Hall elements provided in one semiconductor body and the anode and cathode contacts of which are connected together, which sub-Hall elements each have a Hall contact, and in which one half of the Hall contacts is of one polarity and the other half is of the opposite polarity. The sub-Hall elements are divided into groups of each two sub-Hall elements with mutually parallel main current directions, and Hall contacts of the same polarity are connected together. The sub-Hall elements advantageously have a common Hall body in the form of a square of another regular polygon, in which the contacts are placed along the edge of the Hall body.

12 Claims, 8 Drawing Figures

MULTISEGMENT HALL ELEMENT FOR OFFSET VOLTAGE COMPENSATION

This is a continuation of Ser. No. 654,557, Filed Feb. 2, 1976 now abandoned; which was a continuation of Ser. No. 474,588, Filed May 30, 1974 now abandoned.

The invention relates to a semiconductor device having a semiconductor body comprising at least one Hall element with a layer-shaped Hall body which is provided with current contacts so as to cause a current to flow through the Hall body in the lateral direction and with at least one Hall contact for deriving electric Hall signals which can be generated in the Hall body by means of a magnetic field.

Devices of the type described are known, for example, from the published Dutch Pat. application No. 67,12327 (corresponding to U.S. Pat. No. 3,522,494, filed Aug. 4, 1970, and assigned to the present assignee) and are frequently used, in particular in commutator-less electric motors in which the current through the windings is alternately switched on and off by means of circuits controlled by one or more Hall elements. Such semiconductor devices are used in addition in amplifier circuits having an amplification factor which is controllable by the Hall element and in various other applications, for example, as contact-less switches.

In known devices the body of a Hall element usually has an approximately rectangular shape and comprises two current contacts for conveying a current through the Hall body and at least one, but usually two Hall contacts which are present between said current contacts and which serve to derive a Hall signal generated by a magnetic field in the Hall body transversely to the direction of current.

The "offset" of the Hall element is of prime importance for the practical application of devices having a Hall element of the type described. "Offset" is to be understood to mean the phenomenon that in the operating condition, in the absence of a magnetic field having a field strength component perpendicular to the layer-shaped Hall body, the Hall signal is not equal to zero. The "offset" is expressed either as the value of the Hall signal voltage in the absence of a magnetic field, or as the magnetic field strength which should be applied in order to reduce the offset signal to zero.

It will generally be desirable that the offset of the Hall element be as small as possible since in many applications the magnetic field which is required to obtain a given Hall signal will be larger in the presence of offset than in the absence thereof. The magnetic fields required as a result of the occurrence of offset may in such a device often be 1500 Gauss or more, which in practice often involves particular difficulties.

A further complication occurs due to the fact that the offset depends considerably upon mechanical influences, such as pressure and bending, and on other factors, such as, for example, the energy dissipation in the Hall element and temperature differences across the Hall element caused thereby as a result of which in the operating condition the offset generally does not remain constant.

It has been endeavoured in various manners to eliminate or at least considerably reduce the influence of the said offset by combination of several Hall elements in a monolithic circuit, in the same semiconductor body.

It is suggested, for example, in an article in IBM Technical Disclosure Bulletin, Vol. 12, No. 12, May, 1970, p. 2163 to combine a Hall element subjected to a magnetic field with a second reference Hall element which is substantially not subjected to the magnetic field and hence supplies only an offset signal, and to subtract the two resulting Hall signals from each other.

A quite different solution is proposed in the non-prepublished Dutch Pat. application No. 72.07395 of applicants (PHN 6302) (corresponding to U.S. Pat. No. 3,822,354, issued July 9, 1974, and assigned to the present assignee) in which the fact is used that the offset appears to be dependent upon the direction of current through the Hall body and varies with the cosine of the double angle between the current direction and any reference axis parallel to the surface. According to this method two or more Hall elements which are subjected to substantially the same magnetic field are mutually connected in parallel, the directions of current of the Hall elements being different and chosen to be so that the resulting offset of the parallel arranged Hall elements is suppressed or at least considerably reduced.

It can be proved that with suitably chosen angles at least the differential offset component can be substantially suppressed. It is to be noted that the total offset in general is composed of a differential component which is expressed in a difference voltage between the two Hall contacts of the Hall element and a so-called "common mode" component which is expressed in a potential shift relative to the potential in the absence of offset, which shift is identical for both Hall contacts.

The offset proves to be considerably dependent upon the variation of the sheet resistance of the Hall body, i.e. the average resistivity divided by the layer thickness of the Hall body. Said sheet resistance may to an approximation be described as a second degree function of the coordinates of the form.

$$\rho_s = \rho_o + a_1 x + b_1 y + a_2 x^2 + b_2 y^2 + kxy + \ldots$$

It has been found that with suitably chosen directions of current in the last-mentioned compensation method the differential offset component can be substantially entirely suppressed but that in the resulting "common mode" component the first order terms, that is to say the coefficients $a_1$ and $b_1$, of the sheet resistance still play a part, which in many applications is of minor importance but in other cases is undesirable.

It is one of the objects of the invention to provide a new solution to suppress the offset effect in which both a better compensation of the offset and a greater compactness as compared with the known devices can be obtained.

The invention is inter alia based on the recognition that due to another arrangement and interconnection of the composing sub-Hall elements, not only a suppression of the differential offset component but also a considerable reduction of the said "common mode" offset can be obtained, which for various important applications is highly desirable.

The invention is furthermore based on the recognition that the compensation of the offset and in particular of the pressure sensitivity of the offset can be better realised the more closely the sub-Hall elements are present together, that in the solutions used so far the desired optimum compactness cannot be sufficiently realised, and that by using another configuration and interconnection a considerably greater compactness and hence a better offset suppression can be achieved.

Therefore, a semiconductor device of the type mentioned in the preamble is characterized according to the invention in that in order to reduce the offset, the Hall element comprises a number of sub-Hall elements having a layer-shaped Hall body which extends parallel to a surface of the semiconductor body, which sub-Hall elements each comprise an anode contact, a cathode contact and only one Hall contact provided with a connection conductor, that both the anode contacts and the cathode contacts are electrically connected together, that the sub-Hall elements are divided into at least two groups that each have two sub-Hall elements having mutually substantially parallel main current directions, the main current directions of different groups being different, and that one half of the Hall contacts are of one polarity and the other half are of the other polarity, Hall contacts of the same polarity being connected together electrically and having a connection conductor.

In accordance with the above, the main current direction of a sub-Hall element should be understood to mean in the present application the direction of the shortest connection line between the respective anode and cathode contacts of said sub-Hall elements.

Furthermore, each sub-Hall element of a device according to the invention comprises only one Hall contact of one polarity having a connection conductor, in contrast with conventional Hall elements which usually each have two Hall contacts from which, when a current is conveyed through the Hall body via the current contacts, Hall signals of opposite polarity can be derived under the influence of an external magnetic field.

It is furthermore to be noted that the term current direction is to be understood to mean the conventional current direction from a high to a low potential and that the terms anode contact and cathode contact and polarity of a Hall contact relate to the instantaneous condition, that is to say that, for example, when applying an alternating voltage between the current contacts of a sub-Hall element, each of the said current contacts serves alternately as an anode contact and a cathode contact.

One of the important advantages of a device according to the invention is that with it not only the differential offset can be substantially entirely suppressed but also that it proves possible to reduce the "common mode" component of the offset in a device according to the invention to a dependence of only a second order term of the sheet resistance, which will usually be of less importance than the first order terms.

An additional very important advantage of the device according to the invention is that the device enables the use of sub-Hall elements which are all accommodated in one common Hall body without separation insulation between the Hall bodies of the sub-Hall elements. This permits a very compact structure which enables a very much better suppression of the pressure sensitivity of the offset in addition to a considerable space saving. As a matter of fact, the offset proves to be caused to a considerable extent by non-uniformities in the Hall body which give rise to the already mentioned gradual variation in the sheet resistance of the Hall body which extends over a comparatively large part of the body. Such non-uniformities may be caused by various conditions, for instance by differences in doping and thickness in the layer-shaped Hall body, by temperature variations, but also by mechanical stresses which may be due, for example, to the construction of the envelope or to the method of encapsulation.

Since, as already said, the variation of the sheet resistance as a result of said non-uniformities is substantially the same over a certain region of the body, compensation of the offset can be obtained within such a region by combining Hall signals produced by currents in different directions. According to the invention, by causing currents to flow through the same Hall body in different directions, which body may be kept comparatively small, the coefficients in the said equation for the variation of the sheet resistance will have substantially the same values over the active part of the Hall body so that a strong correlation between the offset of the composing sub-Hall elements and hence a very good compensation, in particular of the pressure sensitivity of the offset, will be achieved.

A very important embodiment according to the invention is characterized in that of each group of two parallel sub-Hall elements the main current directions are directed oppositely while their Hall contacts are of the same polarity. As will be described in greater detail hereinafter, said preferred embodiment presents the possibility of forming a very simple structure having only four sub-Hall elements which can be realised in a very compact manner.

According to another important preferred embodiment with which a very good offset suppression can be achieved but in which the number of sub-Hall elements is at least six, the two parallel sub-Hall elements of each group have the same main current directions while their Hall contacts are of opposite polarity.

In order to obtain an offset suppression which is as effective as possible it is very desirable, in connection with the above-mentioned variation of the offset with the current direction, that the sub-Hall elements with Hall contacts of the same polarity show main current directions in which the sum of the cosines of the double of the angle between each main current direction and any reference axis parallel to the surface is substantially equal to zero. In this case a substantially complete suppression also of the "common mode" component of the offset can be achieved.

The sub-Hall elements may be connected together as separate elements in a monolithic integrated circuit. However, in connection with the above it will be obvious that the advantages of the invention become apparent in particular in the case in which all the sub-Hall elements have one common Hall body.

Of particular interest, in particular when using a Hall element according to the invention in integrated circuits, is a preferred embodiment which is characterized in that the semiconductor body comprises a substrate of one conductivity type and an epitaxial layer of the opposite conductivity type present on the substrate, and that the Hall body is formed by an island-shaped part of the epitaxial layer which is surrounded by an insulation zone which insulates said part electrically from the remaining part of the epitaxial layer. The island-shaped Hall body may have different shapes. A very important preferred embodiment which combines an optimum possibility of offset suppression with a very compact configuration is characterized in that the current contacts on the Hall body are present at the corners of a first regular polygon in which, proceeding along the current contacts, each anode contact is present between two cathode contacts and that the Hall contacts are placed at the corners of a second regular polygon having the same number of corners as the first polygon and being concentric with the first polygon. In order to obtain an optimum offset suppression, the second polygon should be arranged symmetrically relative to the first polygon. It is to be noted, however, that it can prove useful in certain conditions to arrange the two concentric polygons slightly asymmetrically relative to each other. As a result of this, an offset of a fixed value can be obtained for certain applications which, however, does substantially not show any pressure sensitivity.

Although this is not necessary in some cases, when using a common Hall body, of the current contacts and Hall contacts at least the Hall contacts are preferably arranged along the edge of the Hall body.

In an important preferred embodiment in which a common Hall body of very small dimensions having only four sub-Hall elements may be used, the Hall contacts are present at the corners of a square, while the current contacts are present substantially on the centre of the sides of said square. The complementary configuration in which the current contacts are present at the corners and the Hall contacts are present substantially on the centre of the sides of the square may also be used advantageously.

In addition to the advantages resulting from the use of more than two current contacts and several sub-Hall elements, said use may involve the drawback that, in order to obtain a Hall signal of the same value as in a single Hall element, more current is necessary with the same magnetic field. In order to restrict this drawback, according to a further preferred embodiment the edge of the Hall body shows notches which extend between the current contacts and Hall contacts and result in a considerable restriction of the total current strength by reduction of the cross-section of the available current paths.

As already noted above, a Hall element according to the invention is particularly suitable for use in integrated circuits and an important preferred embodiment is therefore characterized in that the Hall body is constituted by an insulated part of an epitaxial layer in which all sub-Hall elements are present and in that further semiconductor circuit elements are provided in the epitaxial layer.

Figure 2:
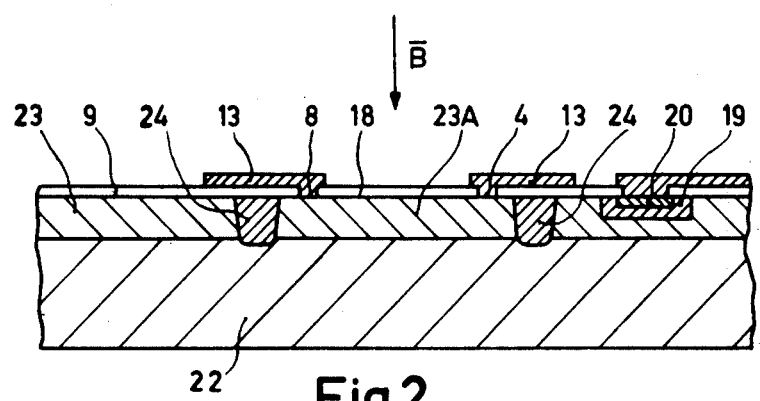
Figure 3:
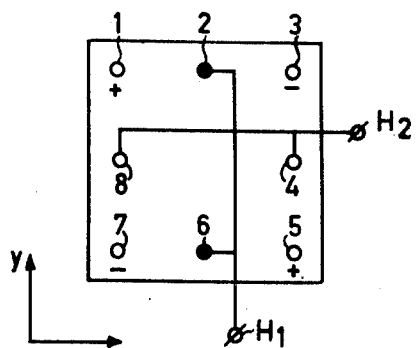
Figure 4:
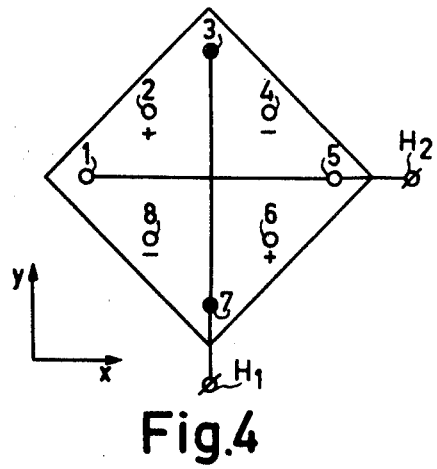
Figure 5:
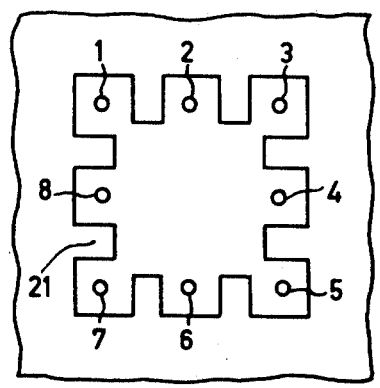
Figure 7:
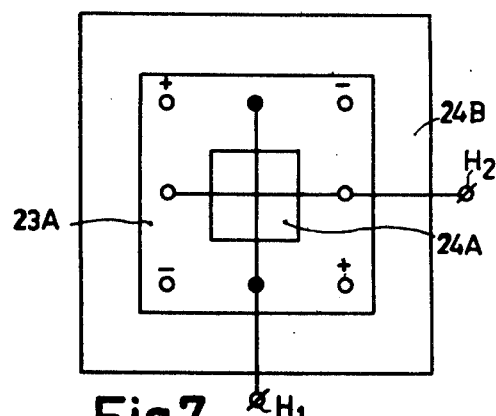
Figure 6:
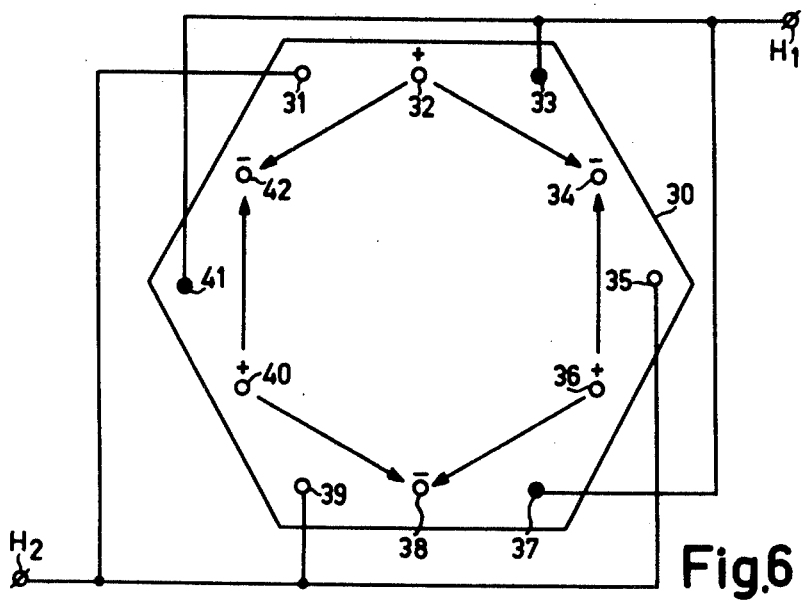
Figure 8:
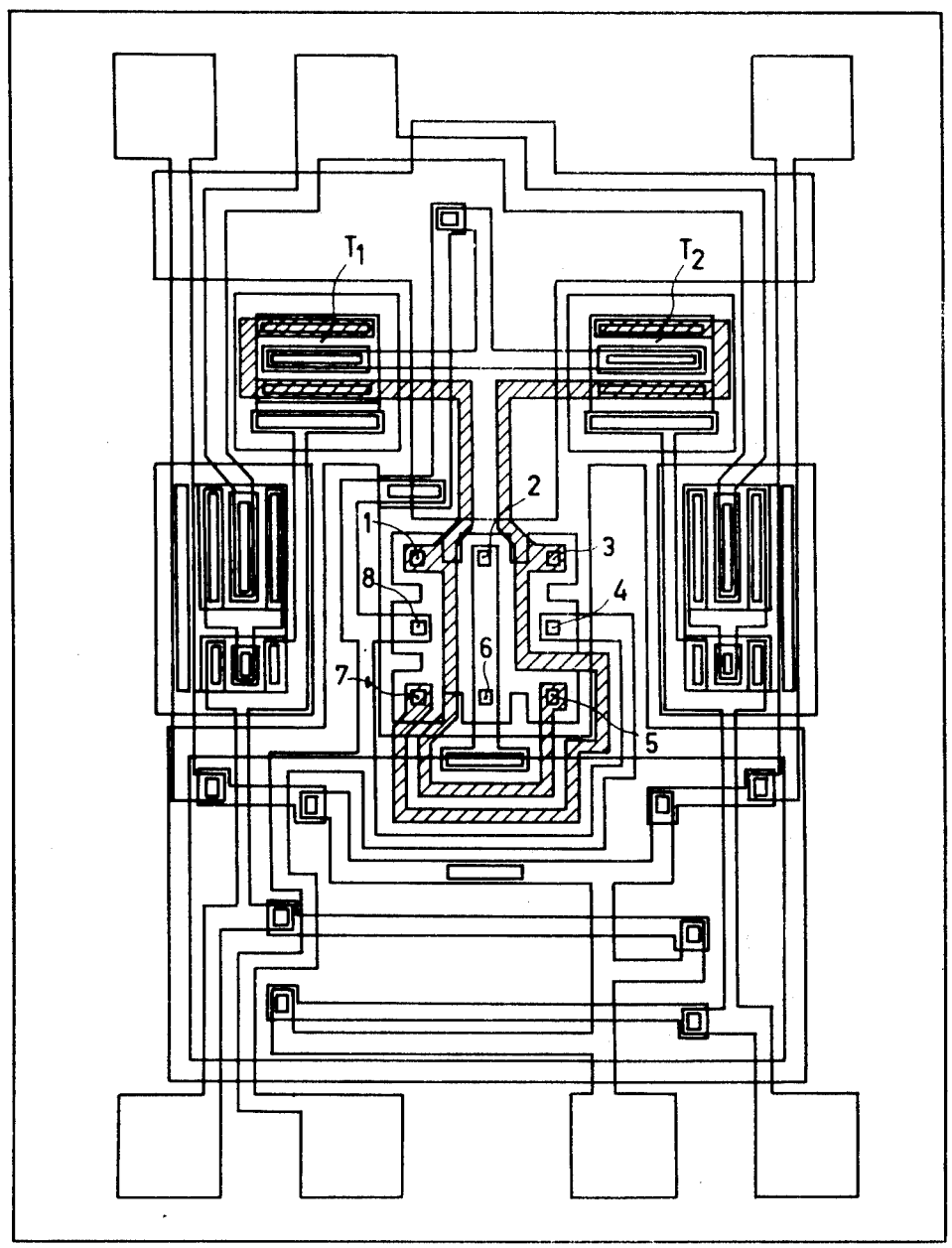

The invention will now be described in greater detail with reference to a few embodiments and the drawing, in which FIG. 1 is a diagrammatic plan view of a part of a device according to the invention, FIG. 2 is a diagrammatic cross-sectional view taken on the line II—II of the device shown in FIG. 1, FIGS. 3 and 4 are diagrammatic plan views of the Hall element of the device shown in FIGS. 1 and 2 in two different circuits, FIG. 5 is a diagrammatic plan view of another embodiment of the Hall element of a device according to the invention, FIG. 6 is a diagrammatic plan view of a device according to the invention with a different structure of the Hall element, FIG. 7 is a diagrammatic plan view of still another embodiment of a Hall element in a device according to the invention, and FIG. 8 is a plan view of an integrated circuit comprising a Hall element shown in FIG. 5.

For clearness' sake the Figures are diagrammatic and not drawn to scale. Corresponding parts in the drawings are generally referred to by the same reference numerals. In the plan view of FIG. 1, metal layers which form the interconnection are shaded.

FIG. 1 is a plan view and FIG. 2 a diagrammatic cross-sectional view taken on the line II—II of a semiconductor device according to the invention. The device comprises a semiconductor body of silicon which consists of a substrate 22 of p-type silicon having a resistivity of approximately 3 ohm.cm, and an epitaxial layer 23 provided thereon of n-type silicon having a resistivity of approximately 1.5 ohm.cm and a thickness of approximately 10 microns.

An island-shaped part 23A of the epitaxial layer is insulated in the usual manner from the remaining part of the semiconductor layer by indiffused p-type zones 24 and constitutes a layer-shaped Hall body which has current contacts via which a current can flow through the Hall body 23A in the lateral direction, that is to say in a direction substantially parallel to the surface 9, and Hall contacts for deriving electric Hall signals which can be generated in the Hall body 23A by means of a magnetic field B (see FIG. 2). Said contacts, in FIG. 1 the contacts 1 to 8, are placed so that the contacts 1, 3, 5 and 7 form a square and that the contacts 2, 4, 6 and 8 are present substantially on the centre of the sides of said square. They may advantageously be connected so that the contacts 2, 4, 6 and 8 serve as current contacts and the contacts 1, 3, 5 and 7 serve as Hall contacts, but also so that the contacts 1, 3, 5 and 7 serve as current contacts and the current contacts 2, 4, 6 and 8 serve as Hall contacts.

At the surface 9 the semiconductor body is covered by an insulating layer 18, for example of silicon dioxide, in which layer 18 contact windows are present above the contacts 1 to 8. The said contacts are connected by means of metal layers 10, 11, 12 and 13, for example aluminium layers, which are shaded in FIG. 1 and which extend on the insulating layer 18 and are connected in this example to metal connection pads 14, 15, 16 and 17 on which connection wires, for example gold wires, can be provided. Instead of this, notably the metal layers which adjoin the Hall contacts may be connected to other circuit elements of a monolithic integrated circuit of which the Hall element forms part, for example to the base of a transistor such as those of which the p-type base zone 19 and the n-type emitter zone 20 are shown in FIGS. 1 and 2. It is furthermore to be noted that the insulation of the island 23A is realized in this case by a p-type zone 24 but that in practice the zone 24 may also consist advantageously of a zone of electrically insulating material, for example thermally grown silicon dioxide, which is at least partly inset in the semiconductor body, or of a groove which extends throughout the thickness of the layer 23 and is filled or is not filled with insulating material, for example, insulating polycrystalline silicon.

According to the invention, the Hall element comprises a number of sub-Hall elements, in this case 4, which are accommodated in the Hall body 23A. If the contacts 2, 4, 6 and 8 are used as current contacts and the contacts 1, 3, 5 and 7 are used as Hall contacts, said sub-Hall elements are constructed from the Hall body 23A and successively the contacts (2, 3, 4), (4, 5, 6), (6, 7, 8) and (8, 1, 2). If a conventional current(flowing from positive to negative potential) is supplied to the interconnected contacts 2 and 6 and is conveyed to the also interconnected contacts 4 and 8, the inter connected Hall contacts 1 and 5 under the influence of the magnetic field B will assume a substantially equal Hall potential of one polarity and the equally interconnected Hall contacts 3 and 7 will assume a substantially equal Hall potential of the opposite polarity. The sub-Hall elements are divided into two groups (2, 3, 4; 6, 7, 8) and (2, 1, 8; 6, 5, 4) each consisting of two sub-Hall elements having substantially parallel main current directions (the connection lines of the contacts 2 and 4, 4 and 6, 6 and 8, 8 and 1), in which the main current directions of $2 \rightarrow 4$ and $6 \rightarrow 8$ of one group enclose an angle of 90° with the main current directions $2 \rightarrow 8$ and $6 \rightarrow 4$ of the other group. According to the above, the Hall contacts 1 and 5 have one polarity and the Hall contacts 3 and 7 of the other groups have the opposite polarity, while the Hall contacts of the same polarity are connected together and are provided with a connection conductor. In this example the two sub-Hall elements of each group, for example (2, 3, 4) and (6, 7, 8), have parallel but opposite main current directions ($2 \rightarrow 4$ and $6 \rightarrow 8$), while the associated Hall contacts 3 and 7 are of the same polarity.

In the device shown in FIGS. 1 and 2, for example, the contacts 1 and 5 may also be used as anode contacts and the contacts 3 and 7 may be used as cathode contacts. The contacts 2, 4, 6 and 8 present on the centre of the sides of the square 1, 3, 5, 7 then are the Hall contacts and in that case also the sub-Hall elements constitute two groups (1, 2, 3; 5, 6, 7) and (3, 4, 5; 7, 8, 1) each of two sub-Hall elements with parallel but oppositely directed main current directions, the Hall contacts 2 and 5 having one polarity and the Hall contacts 4 and 8 having the opposite polarity.

In both cases the current contacts on the Hall body are placed at the corners of a first regular polygon, in this case a square, and, proceeding along the current contacts, each anode contact is present between two cathode contacts, while the Hall contacts are arranged at the corners of a second square which is concentric with the first square and arranged symmetrically relative to the first square. The Hall contacts are arranged along the edge of the Hall body.

In practice the device shown in FIGS. 1 and 2 proves to give a very good suppression of the offset and in particular a very good suppression of the pressure sensitivity of the offset, in both above-described circuits. The dimensions of the Hall body 23A are very small, namely 200 × 200/$\mu$, which is a result of the fact that the sub-Hall elements are not separated from each other and their current paths are actually intermingled more or less. As a result of this, in the approximated equation for the sheet resistance.

$$f_s = f_o + a_1x + b_1y + a_2x^2 + b_2y^2 + kxy + \ldots.$$

the value of the coefficients $a$, $b$ and $k$ is substantially equal throughout the Hall body. On the basis of this, the above-mentioned favourable results can presumably be explained as follows, although the invention and its advantages are by no means dependent upon such an explanation.

FIG. 3 shows diagrammatically the Hall element of FIG. 1 according to one of the described connection possibilities and FIG. 4 shows the other connection possibility. In either case the $x$ and $y$ axis are chosen according to the main current directions in the elements. The interconnected anode contacts are denoted by + and the likewise interconnected cathode contacts are denoted by −, while Hall contacts of the same polarity are denoted by circles and dots, respectively, and the Hall connections of the device are denoted by $H_1$ and $H_2$. Attention is drawn to the fact that, in order to avoid complexity of the drawings, the electric interconnection of the anode contacts (+) and that of the cathode contacts (−) are omitted in FIGS. 3, 4, 6 and 7.

When the sheet resistance varies monotonously from high to low in the $x$ direction, whereas it remains constant in the $y$ direction, the Hall contact 2 in the case of FIG. 3 will obtain a lower and the Hall contact 6 will obtain a correspondingly higher potential as a result of the first order term $a_1x$ in the equation. The resulting offset on the Hall connection $H_1$ will thus be zero in the first order term, whereas said variation of the resistance in the $x$ direction will have no influence on the Hall connection $H_2$. In an analogous manner it is seen that the first order term $b_1y$ has no influence on the offset. It may be understood for reasons of symmetry that the second order terms $a_2x^2$ and $b_2x^2$ have no influence. In order to find out the influence of the second order term $kxy$ it may be assumed, for example, that the sheet resistance falls from a higher value in the quadrants of the contacts 3 and 7 to a lower value in the quadrants where the contacts 1 and 5 are present. As a result of this both the potential of the contacts 2 and 6 and those of 4 and 8 shift in a positive direction. The common mode component of the offset caused thereby, however, only depends upon the second order term $kxy$.

The reasoning for the case of FIG. 4 occurs quite analogously and leads to the same result.

It will be obvious that the devices described with reference to FIGS. 1 to 4 consume more current than one single or two parallel arranged Hall elements having the same spacing between the current contacts and the same sheet resistance of the Hall body as the device described. In order to restrict the consumed power, notches 21 may be provided in the edge of the Hall body as is shown diagrammatically in FIG. 5, which notches extend between each of the current elements and their respective associated Hall elements. It is found indeed in practice that in this manner the current consumption can be restricted considerably, while nevertheless the advantages of the device according to the invention are maintained entirely or for the greater part. Of course, the notches need not have the shape as is shown in FIG. 5 but may also have any other shape.

It has been found that the device shown in FIGS. 1 and 2 (which may also be constructed in the form of FIG. 5) yields different sensitivities in accordance with the fact whether the circuit shown in FIG. 3 or that shown in FIG. 4 is used. It has been found that the current consumption in the circuit shown in FIG. 4 is higher, as was to be expected, but that the sensitivity when using the same magnetic field $\bar{B}$ is also larger, namely that the sensitivity increases proportionally with the increase of the current consumption. So a particularly interesting advantage of such a device according to the invention is that by exchanging the function of the current contact and Hall contacts in the same Hall element the sensitivity of the Hall element can be made to vary considerably.

In the devices shown in FIGS. 1 to 5, the current contacts and Hall contacts are provided at the corners of a square. Other squares may also be used, for example, a rhomb or another parallelogram, provided the sub-Hall elements can be divided into groups of two mutually parallel elements. In that case, however, the offset suppression is not optimum as a rule. Polygons having an even number of corners exceeding four may also be used in which, however, the number of current contacts and hence the current consumption still further increases. In some cases, however, this may be compensated for by extra advantages. By way of example, FIG. 6 is a diagrammatic plan view of a device having a Hall body 30 which comprises six sub-Hall elements whose main current directions are denoted by arrows and in which the anode contacts (+) (32, 36, 40) which are interconnected and the likewise interconnected cathode contacts (−) (34, 38, 42) are present at the corners of a regular hexagon, while the Hall contacts of one polarity (31, 35, 39) and of the opposite polarity (33, 37, 41) are present at the corners of another hexagon which is concentric with the first hexagon and is arranged symmetrically with respect to same. This device is composed of three pairs of sub-Hall elements of which each pair consists of two components (for example, (40, 41, 42) and (36, 35, 34)), of which the main current directions, in contrast with the preceding example, are in the same directions and of which the Hall contacts 41 and 35, also in contrast with the preceding example, are of opposite polarities. In this figure also, Hall contacts having the same polarity are denoted in the same manner. The advantage of the device shown in FIG. 6 is that in this case also the "common mode" component of the offset which in the device shown in FIGS. 1 to 5 was still present as a second order term, is fully suppressed in this case also since in this case the sub-Hall elements with Hall contacts of the same polarity (for example (32, 31, 42), (34, 35, 36) and (38, 39, 40)) show main current directions which mutually enclose angles of 120° and hence satisfy the condition that the sum of the cosines of the double of the angle between each main current direction and any reference axis parallel to the surface be substantially equal to zero, as can easily be found out. This condition is related to the fact that the offset varies sinusoidally with the double of the said angle, see as regards this also the already mentioned Dutch Pat. application 72.07395 (PHN 6302).

It is not necessary for the sub-Hall elements, as in the so far described devices according to the invention, to have current paths which overlap each other. The device according to the invention can also be realised with sub-Hall elements of which the current paths are substantially entirely separated. See, for example, FIG. 7 which shows a device according to the invention which is substantially the same as that of FIGS. 1 and 2 but differs therefrom only in that the sub-Hall elements have separated current paths, since the Hall body 23A which is bounded on the outside by the insulation region 24B is divided by the insulation region 24A into four regions having mutually separated current paths. It should be ensured, however, that the Hall contacts are not present symmetrically relative to the edges of the sub-Hall elements to which they belong since otherwise no or only a very small Hall signal can be derived. Such extra insulation regions 24A may in certain circumstances be of advantage since the current consumption is smaller. It is obvious that the sub-Hall elements need not be secured together as is shown in FIG. 7 but may also be insulated from each other in the semiconductor body and be connected together there conductively. However, this requires space. The sub-Hall elements must be formed by parts of the same semiconductor body since otherwise mutual correlation of the offset on which the invention is based is not present.

All the devices described can be manufactured by using methods generally known in semiconductor technology. For example, for manufacturing the device shown in FIGS. 1 and 2 the starting material may be a p-type substrate 22 of silicon having a thickness of approximately 200 microns and a resistivity of approximately 3 ohm.cm. According to known methods an n-type silicon layer 23 having a thickness of approximately 10 microns and a resistivity of approximately 1.5 ohm. cm is provided on said substrate. The p-type insulation zones 24 are then provided while using known photolithographic etching methods, for example, by a boron diffusion. The base zone 19 and the emitter zone 20 are then provided by further conventional diffusion or implantation methods. It is to be noted that, in order to increase the resistance of the Hall body, a p-type surface zone may be provided in the island, if desired simultaneously with the information of the base zone 19, as a result of which the thickness of the Hall body is reduced. Furthermore, if necessary, n-type contact zones may be provided on the Hall body 23A, for example, simultaneously with the formation of the emitter zone 20. In as far as an insulating layer 18 has not yet been formed by the methods used, it is provided in the usual manner succeeded by the formation of contact windows and metallisation. Several of the said devices can be manufactured simultaneously on the same semiconductor plate which can then be divided up into separate elements.

Finally it is to be noted that the invention is not restricted to the embodiments described but that many variations are possible to those skilled in the art without departing from the scope of this invention. For example, instead of silicon a semiconductor body of another semiconductor material for example a III–V compound such as indium arsenide or indium antimonide, may also be used. Furthermore, instead of a substrate of a conductivity type opposite to that of the Hall body, a substrate of an insulating material may also be used while the conductivity types of the semiconductor regions indicated in the embodiments may each be replaced by their opposite conductivity types so that the n-type zones are changed into p-type zones, and conversely.

The resistance of the Hall body may advantageously be increased, for example, by reducing in the embodiments described the thickness of the Hall body by means of a p-type surface zone which, with the exception of the contact places, is provided throughout the surface of the Hall body so that the Hall body extends mainly between the p-type substrate and said p-type surface zone. Such an increase of the resistance may also be obtained by means of a p-type buried layer in which a highly doped p-type surface zone which during the manufacture of the device expands in the epitaxial layer is provided in the substrate at the area of the Hall body.

The Hall element in the device according to the invention may be used in a circuit in the same manner as any other Hall element. For illustration FIG. 8 shows a monolithin integrated circuit in which a Hall element as shown in FIG. 5 is used whose Hall contacts 1 and 5 are connected to the base of transistor $T_1$, while the Hall contacts 3 and 7 are connected to the base of transistor $T_2$, according to the shaded metal tracks. The Hall body has dimensions of 220 × 220 microns; the contacts are all present at approximately 20 microns from the edge.

What is claimed is:

1. A Hall device with substantially suppressed offset voltage comprising a layer-shaped semiconductor body having a central portion and a peripheral portion surrounding said central portion, an even number of at least four current contact members forming a plurality of pairs of anode and cathode contact members distributed in said peripheral portion in alternate spaced arrangement, each cathode contact member being situated between two anode contact members a plurality of pairs of Hall contact members of opposite polarities forming the same even number of Hall contact members distributed in said peripheral portion in alternate spaced arrangement, each Hall contact of one polarity being situated between two Hall contacts of the opposite polarity, only one single Hall contact being present between each pair of successive anode and cathode current contact members and equidistant therefrom thus forming a plurality of adjacent arranged Hall sub-elements, the main current direction between each pair of successive anode and cathode contacts being substantially parallel to the main current direction between an associated pair of anode and cathode contacts situated diametrically opposite on the body, all anode contact members being connected to one single anode input terminal, all cathode contact members being connected to one single cathode input terminal, all Hall contact members of one polarity being connected to one single first Hall output terminal and all Hall contact members of the opposite polarity being connected to one single second Hall output terminal.

2. A semiconductor Hall device as in claim 1, wherein the two associated said Hall sub-elements have oppositely directed main current directions and Hall contacts of the same polarity.

3. A semiconductor Hall device as in claim 1, wherein the two said Hall sub-elements of each said group have main current directions in the same direction and Hall contacts of opposite polarity.

4. A semiconductor Hall device as in claim 3, wherein said Hall sub-elements comprising Hall contacts of the same polarity have respective main current directions in which the sum of the cosines of the double of the angle between each said main current direction and any reference axis parallel to the surface is substantially equal to zero.

5. A semiconductor Hall device as in claim 1, wherein said Hall sub-elements comprise one common Hall body.

6. A semiconductor Hall device as in claim 5, wherein said Hall contacts are disposed along the edge of said Hall body.

7. A semiconductor Hall device as in claim 5, wherein said semiconductor body comprises a substrate of one conductivity type and an expitaxial layer of the opposite conductivity type present on said substrate and said Hall body comprises an island-shaped part of said epitaxial layer, which part is surrounded by an insulation zone that electrically isolates said part from the remaining part of said epitaxial layer.

8. A semiconductor Hall device as in claim 1, comprising further semiconductor circuit elements provided in said epitaxial layer.

9. A semiconductor Hall device as in claim 5, wherein said current contacts on the Hall body are present at the corners of a first regular polygon in which, proceeding along the current contacts, each said anode contact is present between two said cathode contacts, and said Hall contacts are placed at the corners of a second regular polygon having the same number of corners as said first polygon and being concentric with said first polygon.

10. A semiconductor Hall device as in claim 9, wherein said Hall contacts are present at respective corners of a square and said current contacts are present substantially at the centers of respective sides of said square.

11. A semiconductor Hall device as in claim 9, wherein said current contacts are present at respective corners of a square and said Hall contacts are present substantially at the centers of respective sides of said square.

12. A semiconductor Hall device as in claim 9, wherein the edges of said Hall body contain notches which extend between respective said current contacts and Hall contacts.

* * * * *